(12) United States Patent
Huang

(10) Patent No.: US 11,452,377 B1
(45) Date of Patent: Sep. 27, 2022

(54) MOUNTING DEVICE FOR SEMI-PERMANENT MOUNTING OF ELECTRONIC DEVICES

(71) Applicant: Nanning FuLian FuGui Precision Industrial Co., Ltd., Nanning (CN)

(72) Inventor: Liang-Zhen Huang, Nanning (CN)

(73) Assignee: Nanning FuLian FuGui Precision Industrial Co., Ltd., Nanning (CN)

( * ) Notice: Subject to any disclaimer, the term of this patent is extended or adjusted under 35 U.S.C. 154(b) by 0 days.

(21) Appl. No.: 17/329,926

(22) Filed: May 25, 2021

(30) Foreign Application Priority Data

Apr. 8, 2021 (CN) .......................... 202110379052.4

(51) Int. Cl.
  *A47B 96/02* (2006.01)
  *A47B 96/06* (2006.01)
  *F16B 2/02* (2006.01)
  *H05K 5/02* (2006.01)

(52) U.S. Cl.
  CPC .......... *A47B 96/028* (2013.01); *A47B 96/061* (2013.01); *F16B 2/02* (2013.01); *H05K 5/0204* (2013.01)

(58) Field of Classification Search
  CPC ....... A47B 96/028; A47B 96/061; F16B 2/02; H05K 5/0204
  See application file for complete search history.

(56) References Cited

U.S. PATENT DOCUMENTS

| | | | | |
|---|---|---|---|---|
| 6,811,129 B2 * | 11/2004 | Kimura | ................... | B60R 11/02 248/221.11 |
| 8,389,875 B2 * | 3/2013 | Sakakieda | ............ | H05K 5/0204 361/747 |
| 8,456,862 B2 * | 6/2013 | Lee | ........................ | G06F 1/1601 361/679.01 |
| 2009/0052128 A1 * | 2/2009 | Yeh | ...................... | F16M 11/041 361/679.27 |
| 2010/0060116 A1 * | 3/2010 | Okano | ................. | H05K 5/0204 312/352 |
| 2012/0049024 A1 | 3/2012 | Smith | | |

FOREIGN PATENT DOCUMENTS

| | | |
|---|---|---|
| CN | 210624114 U | 5/2020 |
| CN | 211600130 U | 9/2020 |
| TW | M487389 U | 10/2014 |

\* cited by examiner

*Primary Examiner* — Ko H Chan
(74) *Attorney, Agent, or Firm* — ScienBiziP, P.C.

(57) ABSTRACT

A mounting device for quick and easy mounting of an electronic device includes a mounting rack, a locking mechanism, and a support rack. The locking mechanism includes a movable locking rack, a shaft connected to the locking rack, and a locking ring on the shaft. The support rack includes an engaging element and groove, and when the support rack is moved toward the mounting rack during mounting, the free end of the engaging element passes through the lower side of the locking rack, and pushes against the locking ring. When mounted on the mounting rack, the bottom of the locking ring is in the engaging groove. When the support rack is raised up, the engaging element raises the locking rack to the magnetic part, and the locking rack is magnetically held to the magnetic part.

10 Claims, 8 Drawing Sheets

MOUNTING DEVICE FOR SEMI-PERMANENT MOUNTING OF ELECTRONIC DEVICES

FIELD

The subject matter herein generally relates to mounting devices.

BACKGROUND

Wireless access points and wireless routers are widely installed in indoor environments. In order to facilitate user installation, many such wireless communication devices are designed to be hung on the wall by a mounting device.

However, the installation process of such devices may be complicated, and difficult for users to install. Consequently, it would be desirable to provide a solution for improving the mounting device.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
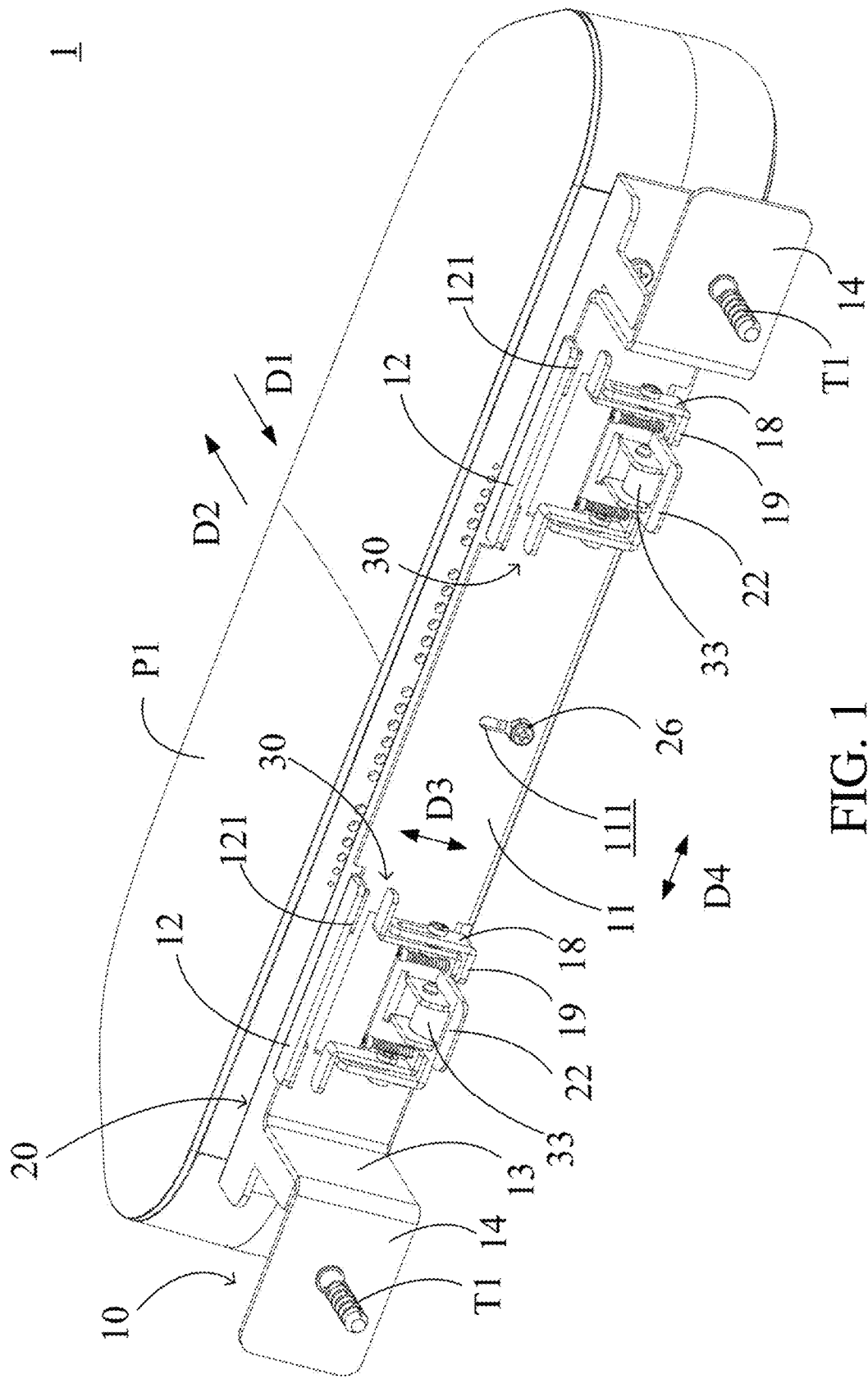
FIG. 1 is a perspective view of a mounting device in an embodiment according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

The term "connected" is defined as directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

Figure 2:
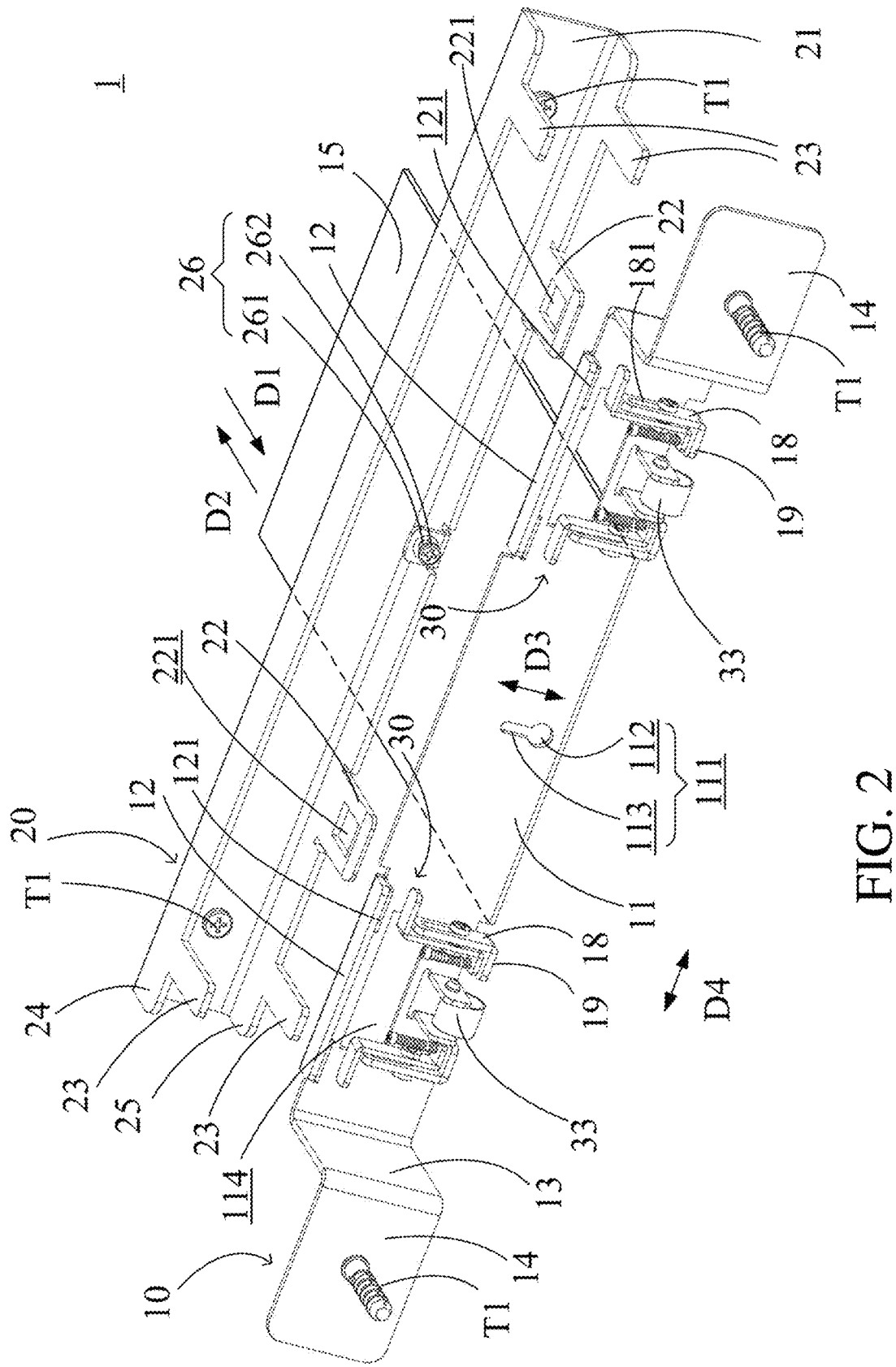
FIG. 2 is an exploded view of the mounting device in FIG. 1.

FIG. 1 is a perspective view of a mounting device 1 in embodiments of the present disclosure. FIG. 2 is an exploded view of the mounting device of FIG. 1. The mounting device 1 is configured to mount a product P1 on a wall. The mounting device 1 includes a mounting rack 10, a support rack 20, and a locking mechanism 30. The mounting rack 10 can be fastened on the wall by fastening elements T1. Moreover, the support rack 20 can be fastened on the product P1 by fastening elements T1. In the embodiment, the fastening elements T1 may be screws. The locking mechanism 30 is disposed on the mounting rack 10. The support rack 20 can be mounted on the mounting rack 10 by the locking mechanism 30. In addition, the product P1 can be various types of electronic devices, such as wireless access points, wireless routers, computers, display devices, or projectors.

In the embodiment, after mounting rack 10 is mounted on the wall, and the product P1 is affixed to the support rack 20, the support rack 20 can be inserted into the locking mechanism 30 in a mounting direction D1, and thus the assembly of the support rack 20 and the mounting rack 10 can be easily completed. Therefore, the difficulty of mounting the mounting device 1 can be reduced. In the embodiment, the mounting direction D1 can be a horizontal direction.

The mounting rack 10 includes a mounting plate 11, two magnetic parts 12, two connection plates 13, two fastening plates 14, and a bearing plate 15. The mounting plate 11 may be an elongated structure, extending in a traverse direction D4. In the embodiment, the traverse direction D4 is perpendicular to the mounting direction D1. The magnetic part 12 is connected to the upper edge of the mounting plate 11, and extends perpendicular to the mounting plate 11. In the embodiment, the magnetic part 12 is connected to the rear surface of the mounting plate 11. The magnetic part 12 includes one or more magnetic elements 121, facing the locking mechanism 30. In the embodiment, the magnetic elements 121 are magnets.

The connection plate 13 is connected to each opposite edge of the mounting plate 11, and extends perpendicular to the mounting plate 11. In the embodiment, the two connection plates 13 are connected to the rear surface of the mounting plate 11. When the mounting rack 10 is affixed to the wall, the rear surface of the mounting plate 11 faces the wall. Two fastening plates 14 are connected to the connection plates 13, and extend perpendicular to the connection plates 13. The fastening plates 14 are affixed to the wall by the fastening elements T1. In the embodiment, one of the fastening plates 14 and one of the connection plates 13 form an L-shaped structure, and one of the connection plates 13 and the mounting plate 11 form an L-shaped structure. The bearing plate 15 is connected to the lower edge of the mounting plate 11, and extends perpendicular to the mounting plate 11. The bearing plate 15 carries the product P1.

In the embodiment, the bearing plate 15 is connected to the front surface of the mounting plate 11. The front surface of the mounting plate 11 is opposite to the rear surface of the mounting plate 11. The bearing plate 15 extends in the mounting direction D1. In this embodiment, the length of the bearing plate 15 in the mounting direction D1 is substantially equal to the length of the product P1 in the mounting direction D1. Therefore, in the process of mounting the support rack 20 to the mounting rack 10, the product P1 and the support rack 20 can be put on the bearing plate 15. The product P1 and the support rack 20 can be moved or be slid along the bearing plate 15 in the mounting direction D1, to insert the support rack 20 into the locking mechanism 30. Consequently, the assembly of the support rack 20 and the mounting rack 10 can be completed easily and quickly.

The support rack 20 includes a product plate 21, two engaging elements 22, four side blocking plates 23, a top blocking plate 24, a bottom blocking plate 25, and a retaining structure 26. The product plate 21 is an elongated structure, extending in the traverse direction D4. The engaging elements 22 are connected to the lower edge of the product plate 21. The engaging elements 22 can be directly connected to the product plate 21, or indirectly connected to the product plate 21 via the bottom blocking plate 25. In the embodiment, the engaging elements 22 extend perpendicular to the product plate 21, and are connected to the rear surface of the product plate 21. The rear surface of the product plate 21 faces the mounting rack 10. Moreover, each engaging element 22 includes an engaging groove 221.

The side blocking plates 23 are connected to the upper edge and/or the lower edge of the product plate 21. The side blocking plates 23 can be directly connected to the product plate 21, or indirectly connected to the product plate 21 via the top blocking plate 24 and/or the bottom blocking plate 25. In the embodiment, the side blocking plates 23 extend perpendicular to the product plate 21, and are connected to the rear surface of the product plate 21. When the support rack 20 is mounted to the mounting rack 10, the side blocking plates 23 are adjacent to or abut the connection plates 13. In the embodiment, the meaning of the expression "the side blocking plates 23 are adjacent to the connection plates 13" includes the side blocking plates 23 abutting the connection plates 13.

The side blocking plates 23 is configured to restrict the movement of the support rack 20 relative to the mounting rack 10 in the traverse direction D4. Moreover, in the embodiment, there are four side blocking plates 23 located on the upper and lower edges of the two ends of the connection plates 13, and thus the side blocking plates 23 restrict the rotation and transverse movement of the support rack 20 relative to the mounting rack 10.

The top blocking plate 24 is connected to the upper edge of the product plate 21. In the embodiment, the top blocking plate 24 extends perpendicular to the product plate 21, and is connected to the rear surface of the product plate 21. The bottom blocking plate 25 is connected to the lower edge of the product plate 21. In the embodiment, the bottom blocking plate 25 extends perpendicular to the product plate 21, and is connected to the rear surface of the product plate 21. Moreover, the length of the top blocking plate 24 and the length of the bottom blocking plate 25 are each greater than half of the length of the product plate 21. The lengths are measured in the traverse direction D4.

When the support rack 20 is mounted on the mounting rack 10, the top blocking plate 24 and the bottom blocking plate 25 abut the mounting plate 11. The top blocking plate 24 and the bottom blocking plate 25 reinforce the strength of the support rack 20. In some embodiments, the support rack 20 does not include either the top blocking plate 24 or the bottom blocking plate 25 or both. In some embodiments, the top blocking plate 24 and/or the bottom blocking plate 25 are connected to the front surface of the product plate 21. The front surface of the product plate 21 is relative to the rear surface of the product plate 21.

The retaining structure 26 is connected to the lower edge of the product plate 21. The retaining structure 26 can be directly connected to the product plate 21, or indirectly connected to the product plate 21 by the bottom blocking plate 25. In the embodiment, the retaining structure 26 extends perpendicular to the product plate 21, and connected to the rear surface of the product plate 21. The retaining structure 26 is on the center area of the product plate 21 or the bottom blocking plate 25. The mounting plate 11 further includes a positioning hole 111. The positioning hole 111 is in the central area of the mounting plate 11. When the support rack 20 is mounted to the mounting rack 10, the retaining structure 26 is located in the positioning hole 111, and thus movement between the support rack 20 and the mounting rack 10 is restricted.

In the embodiment, the retaining structure 26 is a T-shaped structure. The retaining structure 26 includes a retaining rod 261 and a retaining head 262. The retaining rod 261 is connected to the product plate 21. The retaining head 262 is connected the end of the retaining head 262. The diameter of the retaining head 262 is greater than the diameter of the retaining rod 261. The positioning hole 111 includes a wide section 112 and a narrow section 113. The wide section 112 is connected to the narrow section 113, and the diameter of the wide section 112 is greater than the diameter of the narrow section 113. Moreover, the diameter of the wide section 112 is greater than the diameter of the retaining head 262, the diameter of the retaining head 262 is greater than the diameter of the narrow section 113, and the diameter of the narrow section 113 is greater than the diameter of the retaining rod 261.

In the embodiment, when the support rack 20 is mounted on the mounting rack 10, the retaining head 262 passes through the wide section 112, so that the retaining rod 261 is in the narrow section 113. When the support rack 20 is mounted on the mounting rack 10, and the support rack 20 is raised relative to the mounting rack 10, the retaining rod 261 is in the narrow section 113, and the retaining head 262 prevents escape of the retaining structure 26 from the positioning hole 111.

Figure 3:
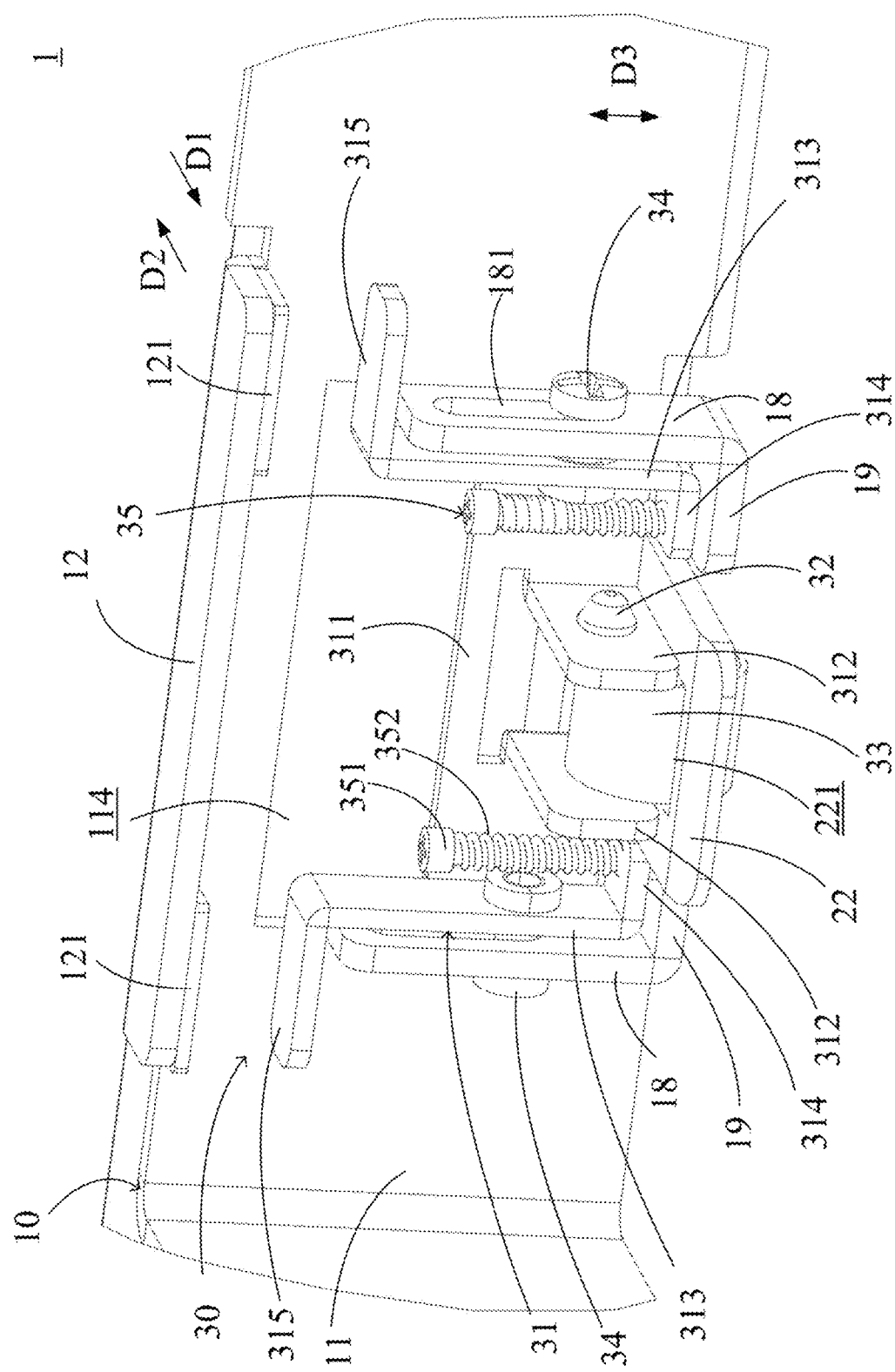
FIG. 3 is an exploded view of a mounting rack and a locking mechanism of the mounting device in an embodiment according to the present disclosure.
Figure 4:
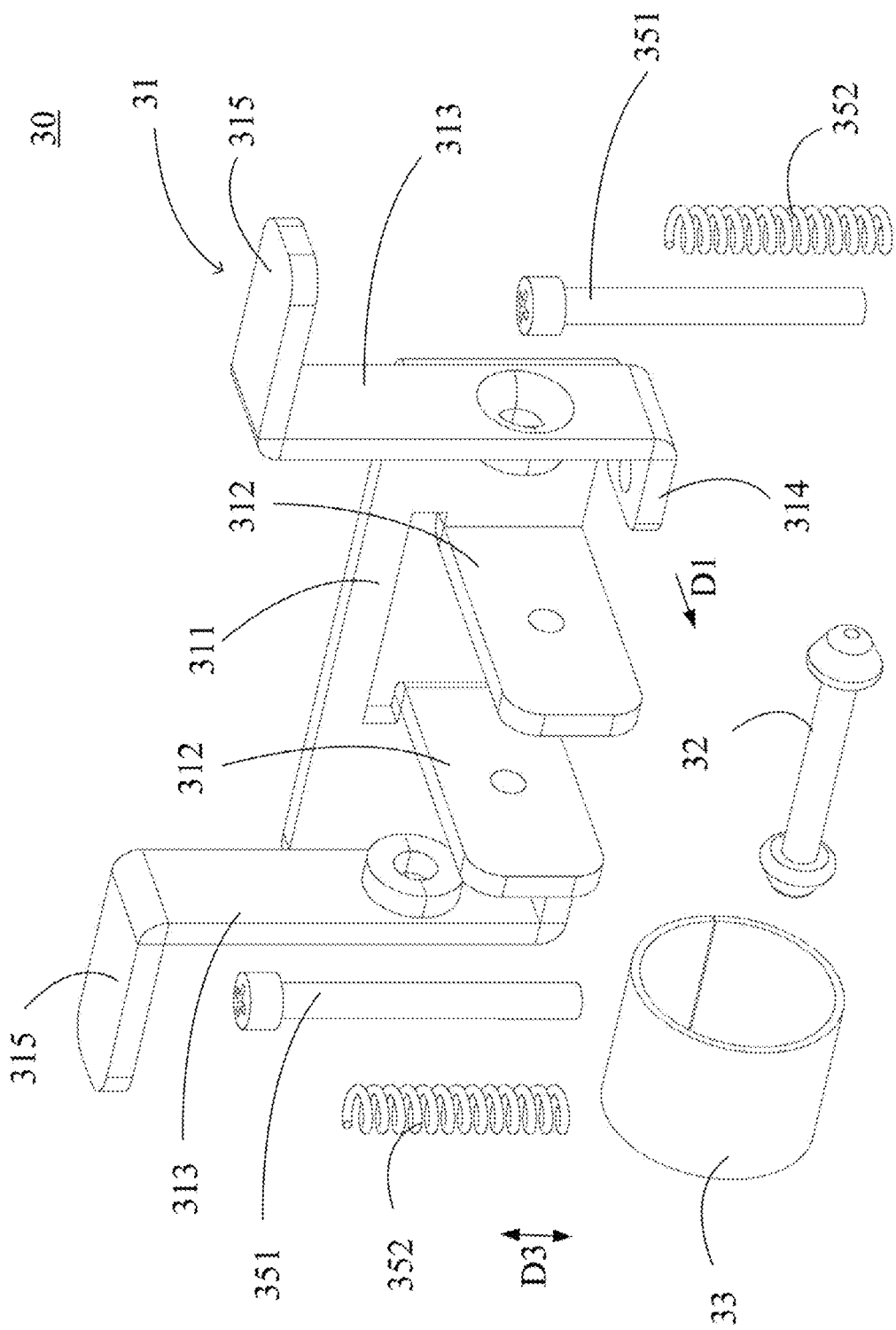
FIG. 4 is an exploded view of the locking mechanism of FIG. 3.

FIG. 3 is an exploded view of the mounting rack 10 and the locking mechanism 30 in embodiments of the present disclosure. FIG. 4 is an exploded view of the locking mechanism 30 in embodiments of the present disclosure. As shown in FIG. 2 and FIG. 3, the mounting plate 11 includes two through holes 114, and the positioning hole 111 is between the through holes 114. The locking mechanism 30 corresponds to the through holes 114. The locking mechanism 30 includes a locking rack 31, a shaft 32, a locking ring 33, two guide elements 34, and two elastic mechanisms 35. The locking rack 31 is moveably disposed on the mounting rack 10. The locking rack 31 can be moved up or down relative to the mounting rack 10 in a vertical direction D3. The vertical direction D3 is perpendicular to the mounting and traverse directions D1 and D4.

The locking rack 31 includes a locking plate 311, two extension elements 312, two side plates 313, two bottom plates 314, and two attaching plates 315. In the embodiment, the locking plate 311, the extension elements 312, the side plates 313, the bottom plates 314, and the attaching plates 315 are formed from a metal plate through stamping and/or bending process. The locking plate 311 extends perpendicular to mounting direction D1, and faces the through hole 114. The extension elements 312 are connected to the locking plate 311, and extend perpendicular to locking plate 311. In other words, the extension elements 312 are parallel to each other.

The ends of the shaft 32 are connected to the extension elements 312 of the locking rack 31. In the embodiment, the ends of the shaft 32 are pivoted on the extension elements 312. In the embodiment, the ends of the shaft 32 pass through the extension elements 312. Moreover, the shaft 32 extends perpendicular to the mounting direction D1. The locking ring 33 surrounds the shaft 32, and is between the extension elements 312. In other words, the shaft 32 passes through the inside of the locking ring 33. In the embodiment, the width of the locking ring 33 is greater than half of the length of the shaft 32. The width of the locking ring 33 and the length of the shaft 32 are measured in the traverse direction D4. Moreover, the diameter of the locking ring 33 is two or three times greater than the diameter of the shaft 32. The diameter of the locking ring 33 and the diameter of the shaft 32 are measured in the mounting direction D1.

The side plates 313 are connected to the locking plate 311, and extend perpendicular to the locking plate 311. The extension elements 312, the shaft 32, and the locking ring 33 are between the side plates 313. The mounting rack 10 further includes guide bases 18. The guide bases 18 are connected to the mounting plate 11, and extend perpendicular to the mounting plate 11. In the embodiment, the guide bases 18 and the side plates 313 extend in the vertical direction D3. Each guide base 18 includes a guide groove 181 extending in the vertical direction D3. The guide elements 34 are connected to the side plates 313 and the mounting rack 10. In the embodiment, the guide elements 34 pass through the guide grooves 181, and are affixed to the side plates 313. Therefore, the guide elements 34 restrict the movement of the locking rack 31 relative to the mounting rack 10 in the vertical direction D3.

The bottom plates 314 are directly or indirectly connected to the locking plate 311, and extend perpendicular to the locking plate 311. In the embodiment, the bottom plates 314 are directly connected to the side plates 313. In other words, the bottom plates 314 are connected to the locking plate 311 via the side plates 313. The mounting rack 10 further includes bearing bases 19. The bearing bases 19 are directly or indirectly connected to the mounting plate 11, and extend perpendicular to the mounting plate 11. In the embodiment, the bearing base 19 is directly connected to the guide base 18. In other words, the bearing base 19 is connected to the mounting plate 11 via the guide base 18.

Each elastic mechanism 35 is connected to the bottom plate 314 and the mounting rack 10, and applies an elastic force to the bottom plate 314 in the vertical direction D3. In the embodiment, each elastic mechanism 35 further includes a positioning rod 351 and a spring 352. The positioning rod 351 passes through the bottom plate 314 to connect the bearing base 19, and extends in the vertical direction D3. The spring 352 is disposed on the positioning rod 351. One end of the spring 352 abuts the bottom plate 314, and the other end of the spring 352 abuts the top of the positioning rod 351.

Figure 5:
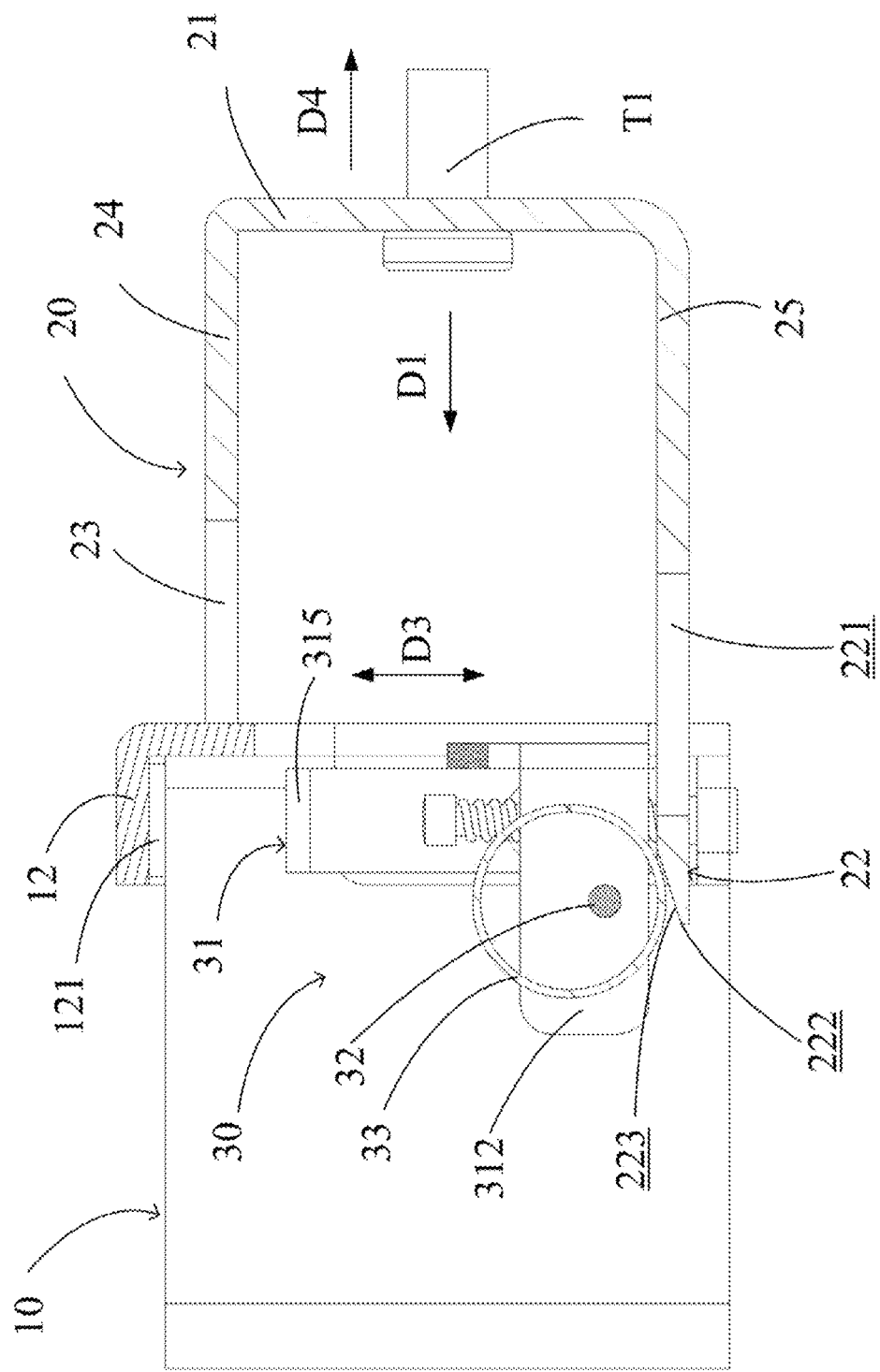
FIG. 5 and FIG. 6 are schematic views of the mounting device during a mounting process.
Figure 6:
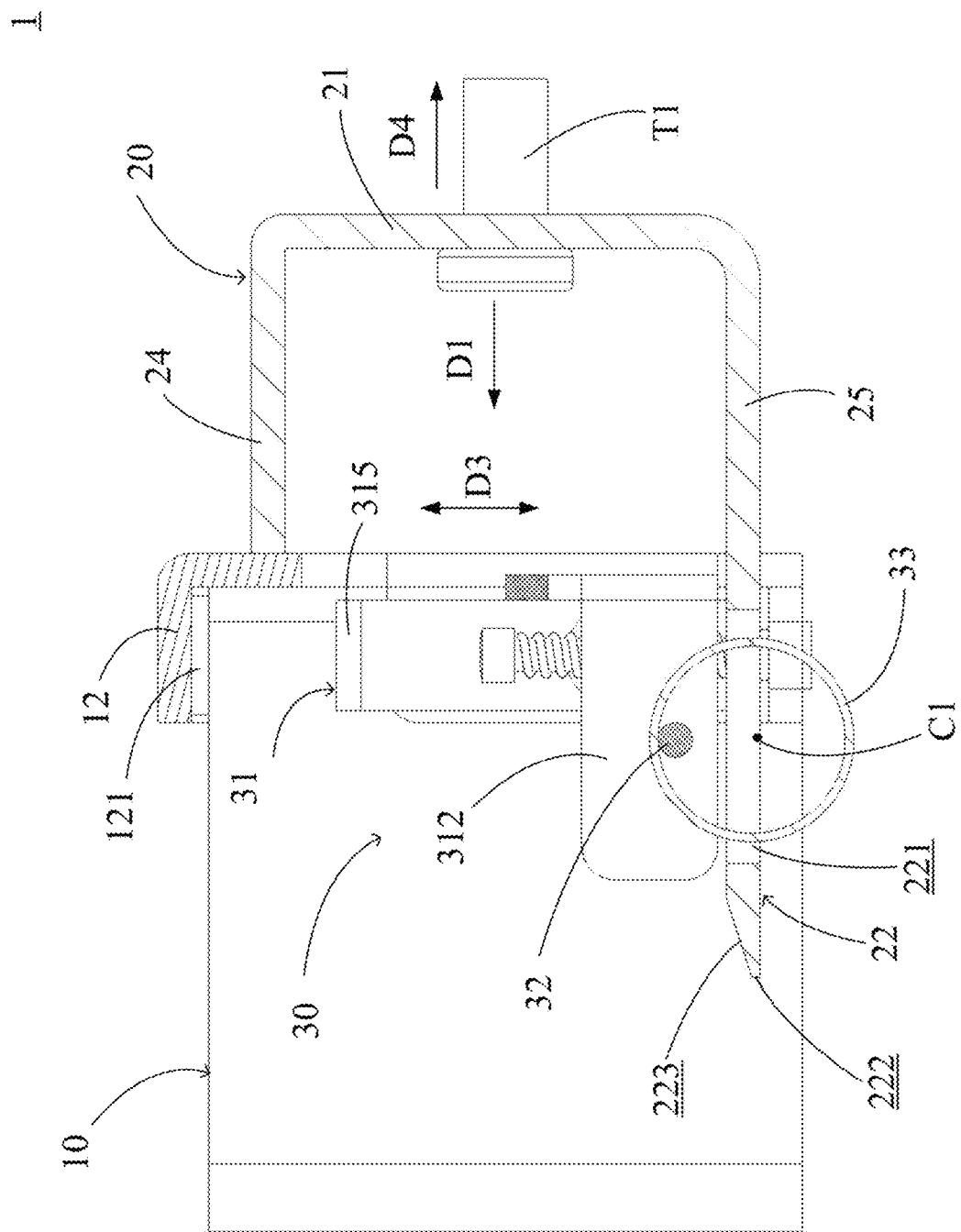

FIG. 5 and FIG. 6 are schematic views of the mounting device 1 during a device-mounting process. In the step of mounting the support rack 20 on the mounting rack 10, the support rack 20 is placed on the bearing plate 15, and then the support rack 20 is moved toward the mounting rack 10 in the mounting direction D1.

As the support rack 20 is moved toward the mounting rack 10 in the mounting direction D1, the free end 222 of the engaging element 22 passes through the lower side of the locking rack 31, and moves the locking ring 33. In the embodiment, since the free end 222 of the engaging element 22 is vertically lower than the center C1 of the locking ring 33, as shown in FIG. 6, the locking ring 33 can be gradually raised along the inclined surface 223, which is connected to the free end 222, after the locking ring 33 is pushed by the free end 222, as shown in FIG. 5. FIG. 6 shows that the support rack 20 is at an installation position when the support rack 20 is mounted in the mounting rack 10. The bottom of the locking ring 33 is in the engaging groove 221, and then the support rack 20 is locked to the mounting rack 10 in a demounting direction D2. In this embodiment, the demounting direction D2 is opposite to the mounting direction D1.

In the embodiment, since the support rack 20 is in the installation position, the bottom of the engaging groove 221 is higher than the center C1 of the locking ring 33. Therefore, when the support rack 20 is moved in the demounting direction D2, the engaging element 22 does not lift up the locking ring 33, resulting in the locking ring 33 being restricted to the engaging groove 221, and preventing movement of the engaging element 22 in the demounting direction D2. Accordingly, in the embodiment, when the support rack 20 is in the installation position relative to the mounting rack 10, the locking ring 33 restricts the movement of the support rack 20 relative to the support rack 20 in the demounting direction D2, thereby preventing detachment of the support rack 20 from the support rack 20 in the demounting direction D2. Therefore, the support rack 20 can be locked on the mounting rack 10 in the demounting direction D2.

FIGS. 5 and 6 are simple schematic diagrams, and those skilled in the art can adjust exact sizes and locations, such as the position of the shaft 32 and the size of the locking ring 33, so that the locking ring 33 prevents the engaging element 22 from moving in the demounting direction D2 and leaving the locking ring 33 when the support rack 20 is in the installation position relative to the mounting rack 10.

Figure 7:
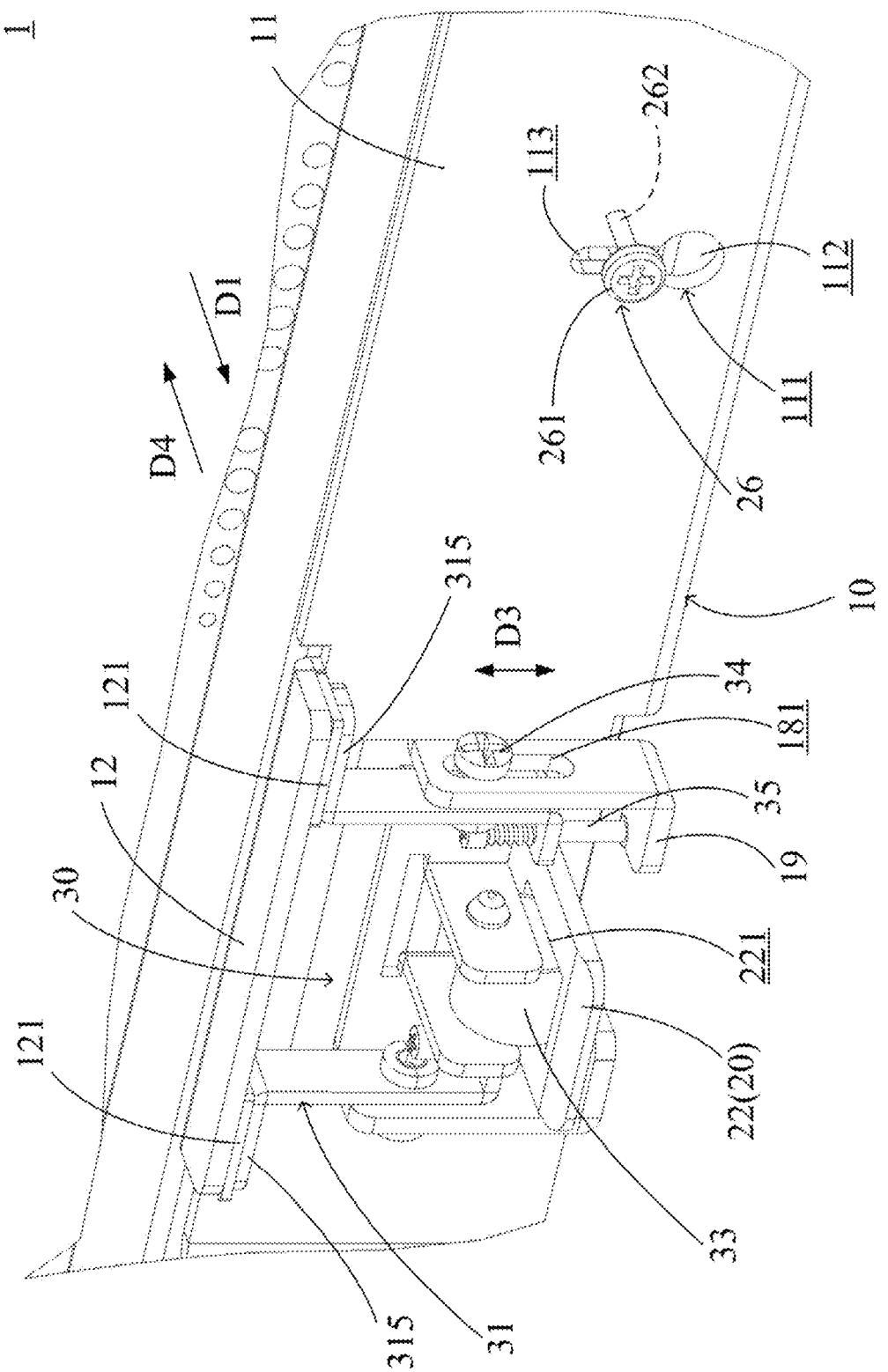
FIG. 7 and FIG. 8 are schematic views of the mounting device during a detachment process.
Figure 8:
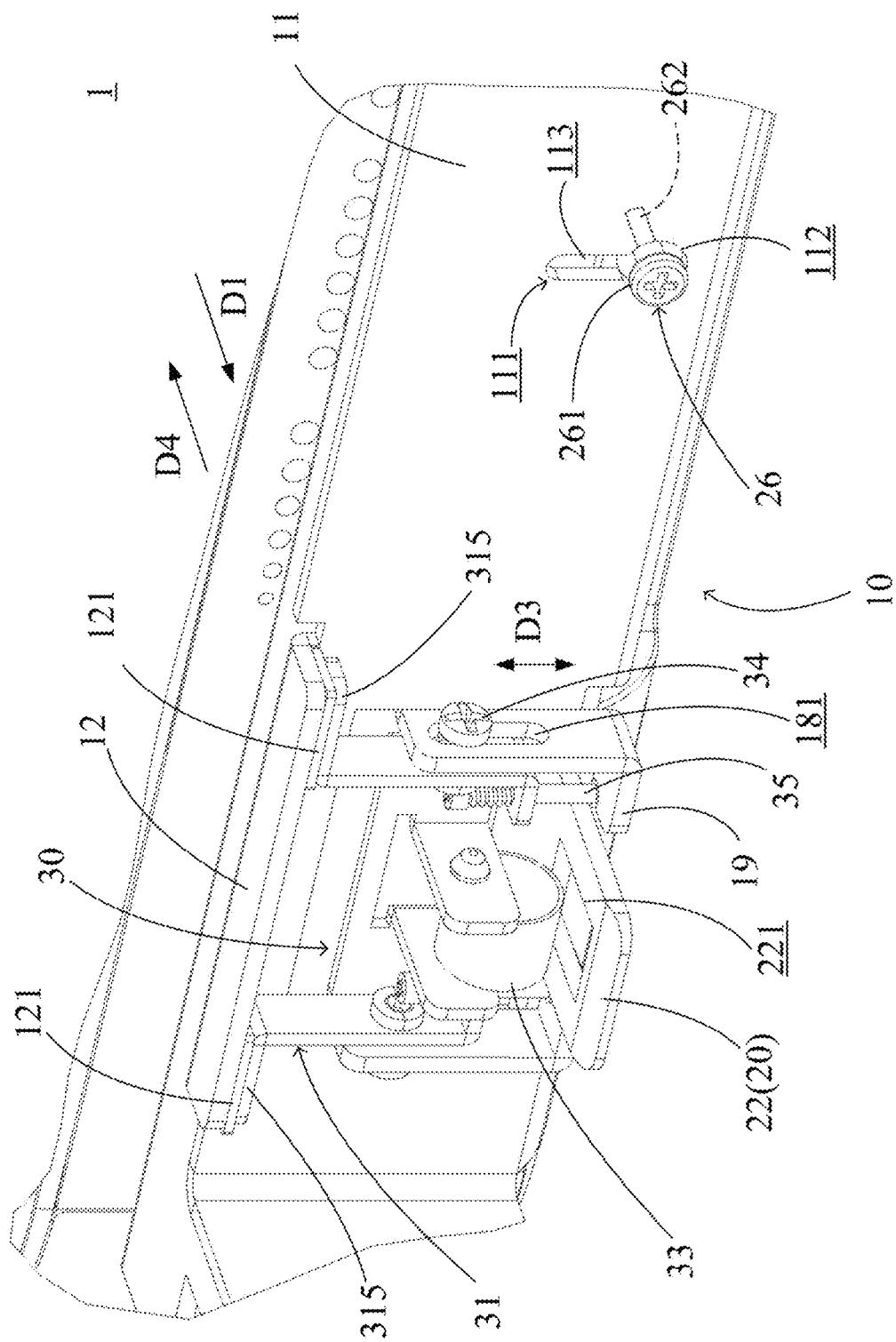

FIG. 7 and FIG. 8 show a detachment process. In the step of detaching the support rack 20 from the mounting rack 10, the support rack 20 can be raised in the vertical direction D3 relative to the mounting rack 10. As shown in FIG. 7, when the support rack 20 moves from the installation position to the raised position, the engaging element 22 raises the locking rack 31 to the raised position and makes contact with the magnetic part 12, so that the magnetic element 121 of the magnetic part 12 attracts the attaching plate 315 of the locking rack 31.

The engaging element 22 is in the through hole 114 of the mounting plate 11. The retaining rod 261 of the retaining structure 26 is in the narrow section 113 of the positioning hole 111. Therefore, the retaining structure 26 and the positioning hole 111 restrict the movement of the support rack 20 in the demounting direction D2 relative to the mounting rack 10 when the support rack 20 is raised relative to the mounting rack 10, so that the support rack 20 is prevented from falling off the mounting rack 10 when the support rack 20 is raised by accidental collisions.

After the magnetic element 121 attaches to the attaching plate 315 of the locking rack 31, the support rack 20 can be lowered back to the installation position relative to the mounting rack 10. As FIG. 8 shows, the locking rack 31 is kept up (in the raised position) due to the magnetic attraction of the magnetic element 121. Therefore, the shaft 32 raises the locking ring 33 so that the center C1 of the locking ring 33 is higher than the engaging element 22 and the engaging groove 221 in the vertical direction D3. At this time, the locking mechanism 30 allows the support rack 20 to move away from the mounting rack 10 in the demounting direction D2, and then the support rack 20 can be detached altogether from the mounting rack 10.

Accordingly, the support rack 20 of the mounting device 1 can be inserted into the locking mechanism 30 in the mounting direction D1, so as to quickly and easily complete an assembly of the support rack 20 and the mounting rack 10.

Many details are often found in the relevant art, thus many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A mounting device comprising:
    a mounting rack comprising a magnetic part;
    a locking mechanism comprising:
        a locking rack movably disposed on the mounting rack;
        a shaft connected to the locking rack; and
        a locking ring surrounding the shaft; and
    a support rack comprising an engaging element, wherein the engaging element comprises an engaging groove;
    wherein when the support rack is moved toward the mounting rack in a mounting direction, a free end of the engaging element passes through a lower side of the locking rack, and pushes the locking ring, and when the support rack is mounted on the mounting rack, a bottom of the locking ring is in the engaging groove,
    wherein when the support rack is moved from an installation position to a raised position, the engaging element raises the locking rack to the magnetic part, and the locking rack is attached to the magnetic part, and
    wherein when the magnetic part is attached to the locking rack, and the support rack is in the installation position, the locking mechanism facilitates the support rack to move away from the mounting rack in a demounting direction that is opposite to the mounting direction.

2. The mounting device as claimed in claim 1, wherein the locking rack further comprises two extension elements, wherein two ends of the shaft are connected to the extension elements, and the locking ring is between the extension elements.

3. The mounting device as claimed in claim 1, wherein the locking rack further comprises a bottom plate, and the locking mechanism further comprises an elastic mechanism connected to the bottom plate and the mounting rack, the elastic mechanism is configure to apply an elastic force to the bottom plate in a vertical direction.

4. The mounting device as claimed in claim 3, wherein the elastic mechanism further comprising:
    a positioning rod extending through the bottom plate, and extending in the vertical direction; and
    a spring disposed on the positioning rod, wherein an end of the spring abuts to the bottom plate.

5. The mounting device as claimed in claim 1, wherein the locking rack further comprises a side plate, and the locking mechanism further comprises a guide element connected to the side plate and the mounting rack, and the locking mechanism is configured to restrict the locking rack from moving relative to the mounting rack in a vertical direction.

6. The mounting device as claimed in claim 1, wherein the mounting rack comprises:
    a mounting plate, wherein the magnetic part is connected to an upper edge of the mounting plate; and
    a connection plate connected to a side edge of the mounting plate;
    wherein the support rack further comprises a product plate and a side blocking plate connected to the product plate, and the engaging element is connected to the product plate,
    wherein when the support rack is mounted on the mounting rack, the side blocking plate is adjacent to the connection plate, and the side blocking plate is configured to restrict a movement of the support rack relative to the mounting rack in a traverse direction.

7. The mounting device as claimed in claim 6, wherein the mounting plate further comprises a positioning hole, and the support rack further comprises a retaining structure disposed on the product plate, and
    when the support rack is mounted on the mounting rack, the retaining structure is in the positioning hole.

8. The mounting device as claimed in claim 6, wherein the mounting rack comprises:
    a mounting plate comprising a through hole,
    the locking mechanism corresponds to the through hole, and
    when the support rack is moved to the raised position, the engaging element is in the through hole.

9. The mounting device as claimed in claim 6, wherein the mounting rack further comprises a bearing plate connected to the mounting plate, the bearing plate is configured to carry a product.

10. The mounting device as claimed in claim 6, wherein the mounting rack further comprises a fastening plate connected to the connection plate,
    the fastening plate is configured to affix to a wall, the fastening plate and the connection plate form an L-shaped structure, and the connection plate and the mounting plate form an L-shaped structure.

* * * * *